Figure 3:
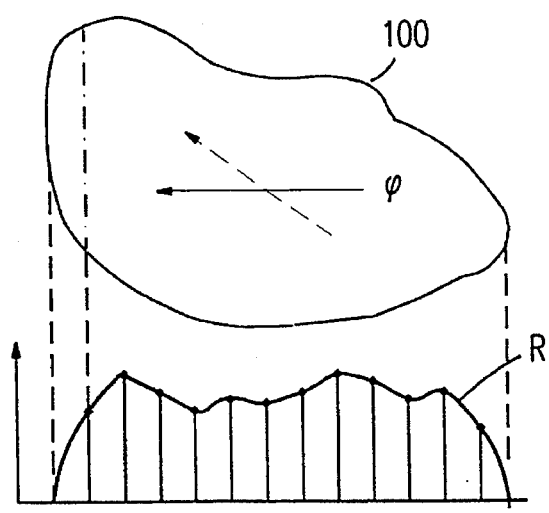

United States Patent [19]
Kuhn et al.

[11] Patent Number: 5,502,385
[45] Date of Patent: Mar. 26, 1996

[54] METHOD OF FORMING A SERIES OF MR IMAGES, AND DEVICE FOR CARRYING OUT THE METHOD

[75] Inventors: Michael H. Kuhn; Volker Rasche; Roland Proksa, all of Hamburg, Germany

[73] Assignee: U.S. Philips Corporation, New York, N.Y.

[21] Appl. No.: 255,510

[22] Filed: Jun. 8, 1994

[30] Foreign Application Priority Data

Jun. 12, 1993 [DE] Germany .................... 43 19 539.3

[51] Int. Cl.⁶ .................................................. G01V 03/14
[52] U.S. Cl. .......................................... 324/309; 324/307
[58] Field of Search .................................. 324/300, 307, 324/309, 310, 311, 313, 314

[56] References Cited

U.S. PATENT DOCUMENTS 4,830,012  5/1989  Riederer .................... 128/653

FOREIGN PATENT DOCUMENTS 0073671  3/1983  European Pat. Off. .

*Primary Examiner*—Sandra L. O'Shea
*Assistant Examiner*—Mack Haynes
*Attorney, Agent, or Firm*—Jack D. Slobod

[57] ABSTRACT

The invention relates to a method of forming a series of MR images in which, in the presence of a steady magnetic field, sequences comprising at least an RF pulse and a magnetic gradient field which is varied from one sequence to another are continuously applied to the examination zone, from the image signals thus generated there being reconstructed MR images, the oldest MR signals used for the reconstruction of an MR image being replaced upon reconstruction of the next MR image by the respective newly generated MR signals. Low-artefact reproduction of dynamic processes in the examination zone can be achieved by varying the direction of the magnetic gradient field active during the generation of an MR signal from one sequence to another so that the range of the magnetic gradient field directions required for the reconstruction is distributed between the respective newly generated MR signals. The invention also relates to a device for carrying out this method.

6 Claims, 3 Drawing Sheets

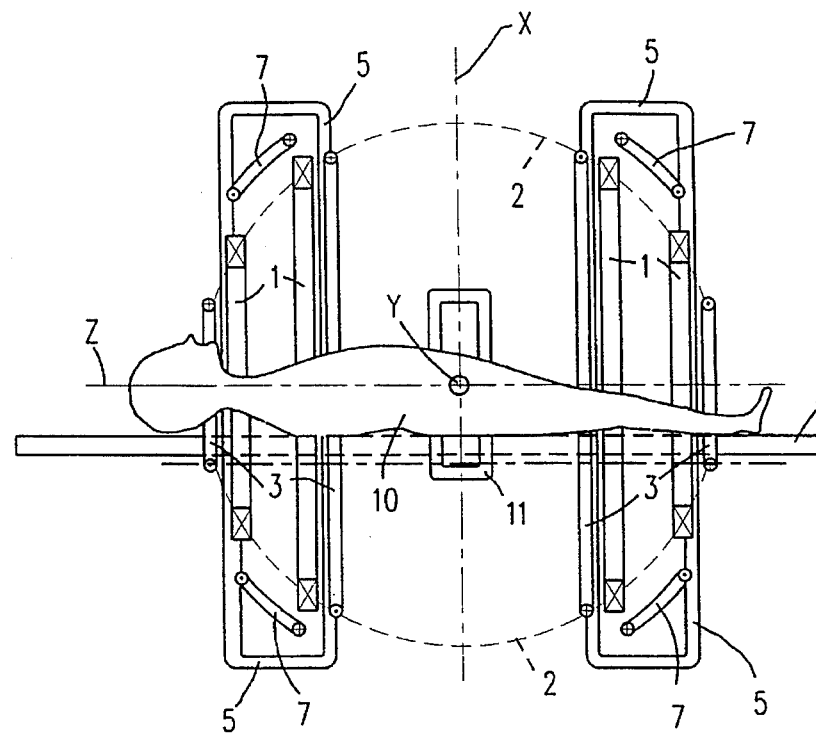
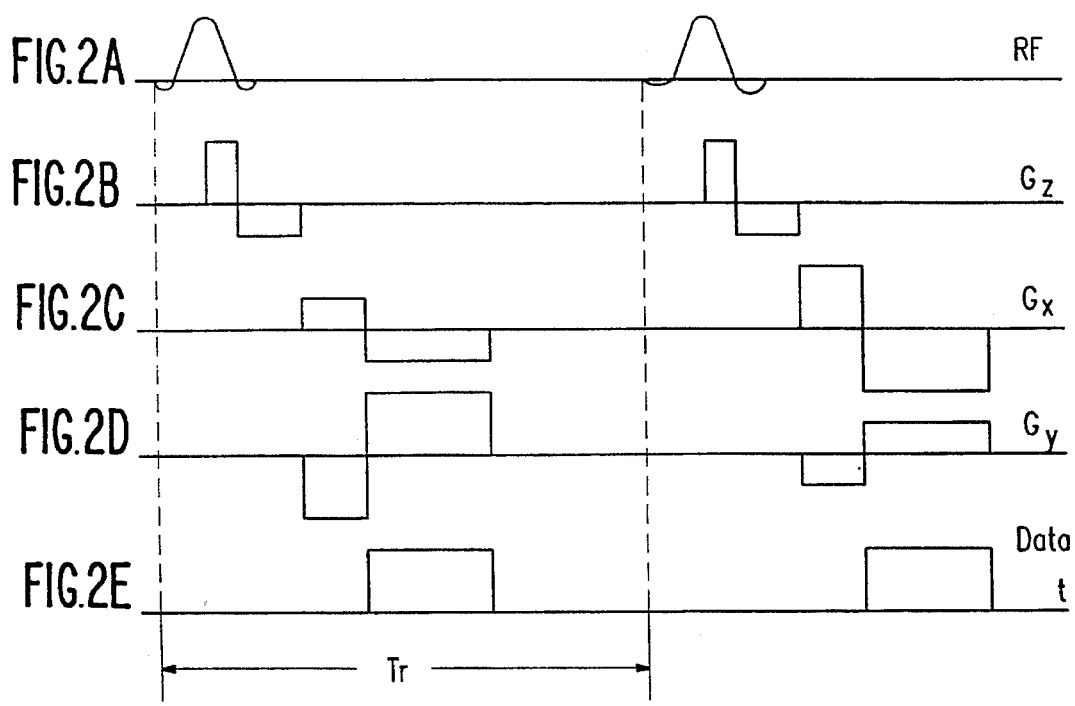

METHOD OF FORMING A SERIES OF MR IMAGES, AND DEVICE FOR CARRYING OUT THE METHOD

The invention relates to a method of forming a series of MR images, in which sequences with at least one RF pulse and a magnetic gradient field which varies from one sequence to another act continuously on the examination zone in the presence of a steady magnetic field, MR images being reconstructed from the MR signals thus generated, the oldest MR signals used for the reconstruction of an MR image being replaced by the respective newly generated MR signals for the reconstruction of the subsequent MR image, and also relates to a device for carrying out this method.

A method and a device of this kind are known from U.S. Pat. No. 4,830,012. This method enables the formation of a fast succession of images with a comparatively high spatial resolution, the time interval between two MR images being substantially smaller than the period of time required for generating a single MR image having this spatial resolution.

According to the known method, first N sequences are generated (where N may be between 16 and 128), the magnitude of a phase encoding gradient, active between the RF pulse and the reading of the MR signal generated thereby, being changed from one sequence to another. The phase encoding gradient extends in a first direction which is perpendicular to a second direction which is the direction of the gradient active during reading. Subsequently, this succession of sequences is repeated once or several times. From the first N sequences a first MR image is reconstructed. This is followed by updating of the MR image by means of the next n MR signals, n being small in comparison with N, for example 2 or 4. The first n MR signals (or their Fourier transforms) are then replaced by the n MR signals last generated, so that ultimately the new MR image is reconstructed from N-n sequences which have already been used for the reconstruction of the preceding MR image and n new MR sequences. The distance in time between two MR images can then be a ratio of n/N smaller than the duration of the period of time required for acquiring the N MR signals required for an image.

Dynamic processes in the examination zone may lead to artefacts in the MR images thus formed, even when the phase encoding gradients for low local frequencies are generated more often than other gradients (U.S. Pat. No. 4,830,012, column 5, lines 19 ff).

It is an object of the invention to provide a method of the kind set forth in which less artefacts occur in the case of dynamic processes in the examination zone. This object is achieved in accordance with the invention in that the direction of the magnetic gradient field active during the formation of an MR signal is varied from one sequence to another so that the range of magnetic gradient field directions required for the reconstruction is uniformly distributed between the respective newly generated MR signals.

The acquisition of the MR signals in conjunction with a gradient field whose direction is varied from one sequence to another corresponds to the known projection-reconstruction method (as opposed to the 2 DF method described in U.S. Pat. No. 4,830,012). From EP-A 73 671 it is known that with this method MR images of low spatial resolution can already be generated by means of a few sequences which are uniformly distributed across the so-called k-space; the known method utilizes this aspect to generate first a coarse image and subsequently an MR image having a higher resolution, if desired.

According to the invention, the gradient directions for the newly added n MR signals for the respective next image are uniformly distributed across the k-space, so that large-area changes in the examination zone can be reproduced with few artefacts in the series of images.

Figure 4:
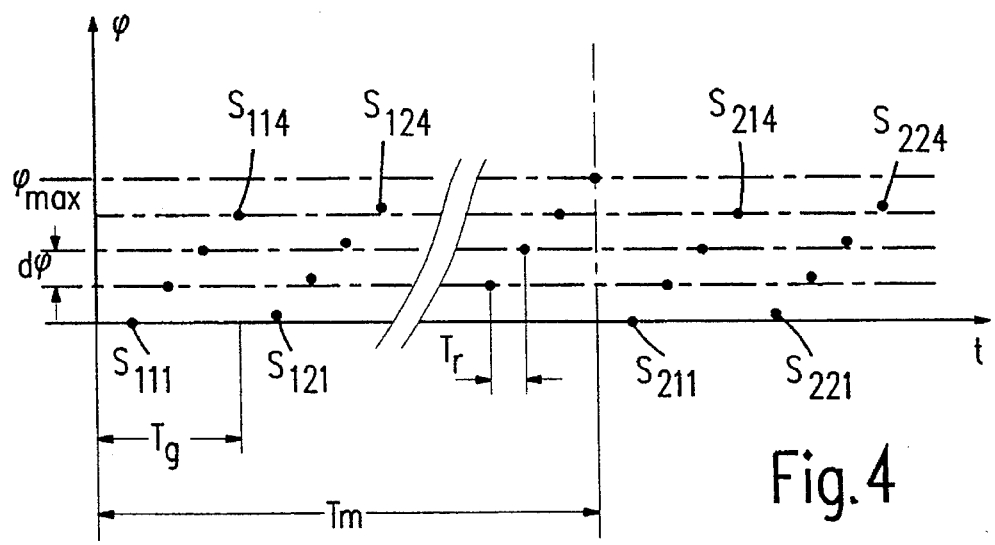
Figure 5:
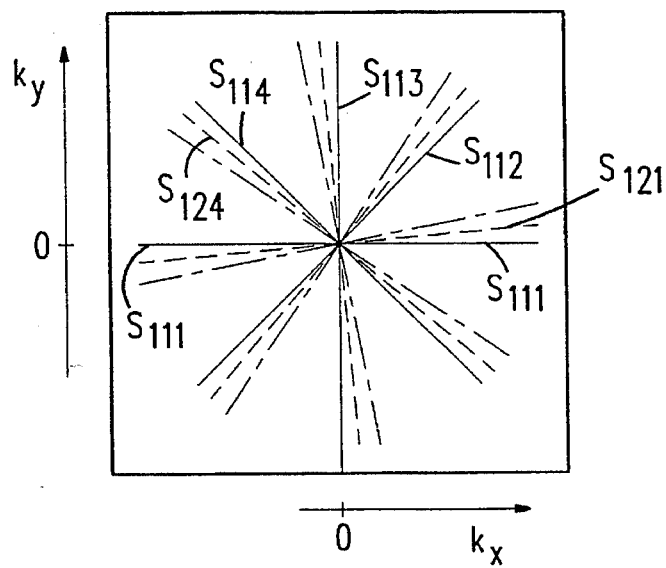
Figure 6:
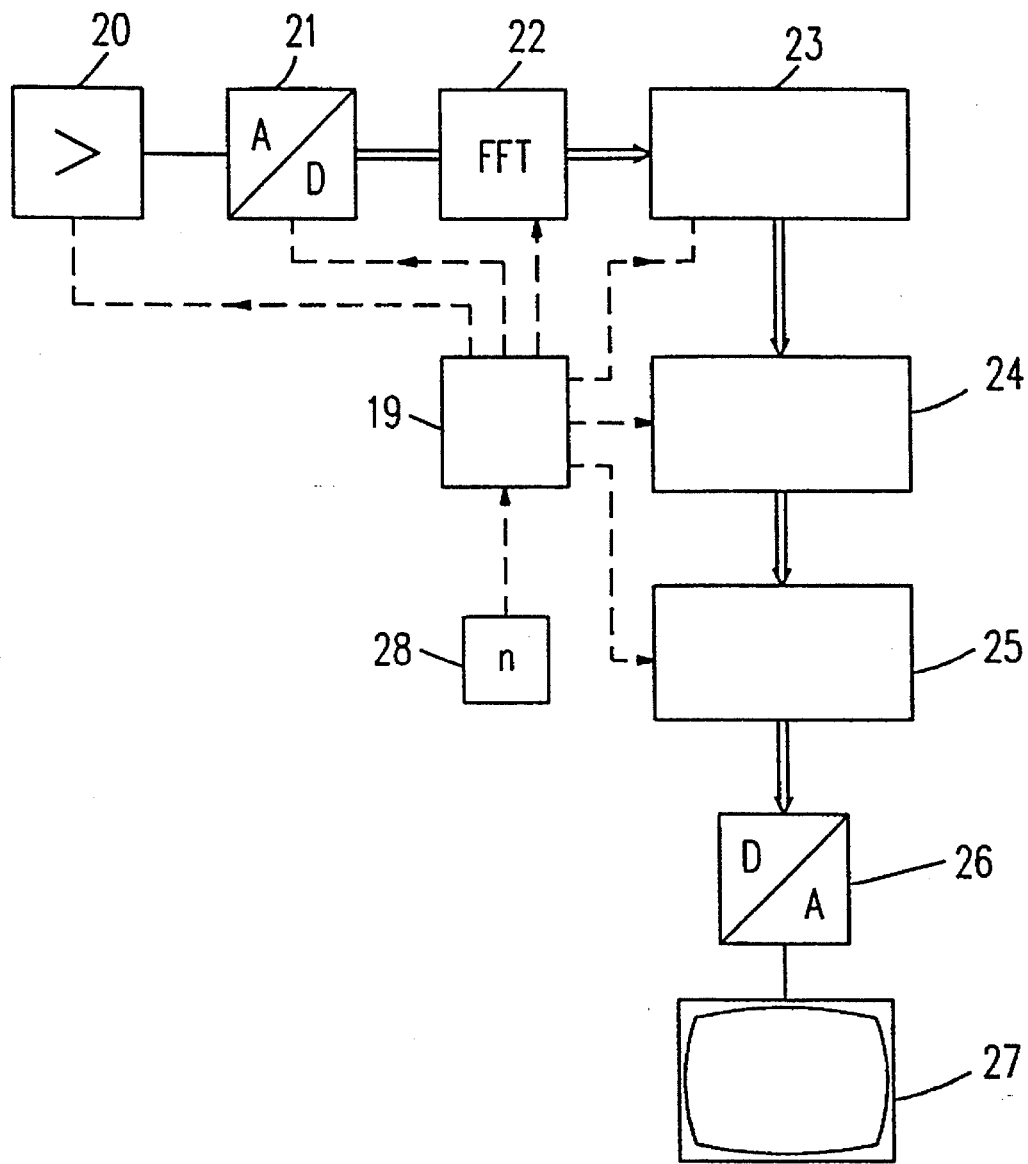

The invention will be described in detail hereinafter with reference to the drawings. Therein:

FIG. 1 shows an apparatus for carrying out the method in accordance with the invention, FIG. 2 shows the variation in time of the sequence used therein, FIG. 3 shows the MR data acquired during a sequence in relation to the examination zone, FIG. 4 shows the temporal succession of the sequences, FIG. 5 shows the scanning of the k-space by the various sequences, FIG. 6 shows a block diagram of a unit for processing the MR signals.

The apparatus shown in FIG. 1 is an MR apparatus which comprises a system of four coils 1 for generating a uniform, steady magnetic field whose strength may be of an order of magnitude of from some tenths of Tesla to some Tesla. The coils 1 are concentrically arranged relative to the z axis and may be provided on a spherical surface 2. The patient 10 to be examined is arranged on a table top 4 within this coil system.

In order to generate a magnetic field which extends in the z direction and which linearly varies in this direction (which field is also referred to hereinafter as a magnetic gradient field), four coils 3 are arranged on the spherical surface 2. There are also provided four coils 7 which generate a magnetic gradient field which also extends in the z direction but whose gradient extends in the x direction (vertically). A magnetic gradient field which extends in the z direction and which has a gradient in the y direction (perpendicular to the plane of the drawing of FIG. 1) is generated by four coils 5 which may be identical to the coils 7 but which are arranged so as to be 90° offset in space with respect thereto. Only two of these four coils are visible in FIG. 1.

Because each of the three coil systems 3, 5 and 7 for generating the magnetic gradient fields is symmetrically arranged relative to the spherical surface, the field strength at the centre of the sphere is determined exclusively by the steady, uniform magnetic field of the coil system 1.

There is also provided an RF coil 11 which generates an essentially uniform RF magnetic field which extends perpendicularly to the direction of the steady, uniform magnetic field (i.e. perpendicularly to the z direction). During each RF pulse the RF coil receives an RF modulated current from an RF generator. The RF coil 11 can also be used for receiving the spin resonance signals generated in the examination zone. However, it is alternatively possible to use a separate RF receiving coil (not shown in FIG. 1) for this purpose.

FIG. 2 shows the position in time of different signals during two successive sequences used for carrying out the method of the invention. The first line shows an RF pulse which is operative as a slice-selective RF pulse in conjunction with a magnetic gradient field $G_z$ (second line). This RF pulse rotates the nuclear magnetization in a slice perpendicular to the z axis through a small flip angle (for example, 5°). Subsequently, two magnetic gradient fields $G_x$ and $G_y$ (third and fourth lines) act simultaneously on the examination zone, the direction of the gradient of both fields being reversed at a given instant. The timing is chosen so that the time integral over the gradient until the reversal of the polarity amounts to half the time integral from the reversal of the polarity until the reactivation of the magnetic gradient field. In principle, however, the part of the magnetic gradient field present before the reversal of the polarity can be dispensed with. While the magnetic gradient fields $G_x$ and $G_y$ are constant, the MR signals generated in the examination zone are amplified, transposed to the baseband and digitized (fifth line of FIG. 2). The number of sampling values thus acquired is dependent on the desired resolution as well as on the magnitude of the examination zone. The digitized MR signals are subjected to one-dimensional Fourier transformation, after which as many transformed values are available as there were previously sampling values.

In FIG. 3 the slice excited by the sequence is denoted by the reference 100 and the direction of the magnetic gradient field in this slice during the sequence is denoted by the reference $\phi$. Below the examination zone there is shown a curve R which represents the frequency spectrum of the MR signal acquired during a sequence. This frequency spectrum is obtained by the one-dimensional Fourier transformation of the MR signal. Because the frequency of the nuclear spins varies linearly as a function of location in the direction $\phi$, the frequency spectrum R represents the projection of the nuclear magnetization on a straight line extending in the direction $\phi$. Each amplitude value of the spectrum corresponds to the line integral of the nuclear magnetization density over a path, perpendicularly to the direction $\phi$, for a given location within the slice. Thus, this projection is obtained from the curve R for each location as denoted by dashed lines.

After a repetition time $T_r$ of, for example 10 ms, the sequence is repeated, the magnitude of the simultaneously applied gradients $G_x$ and $G_y$ being varied in a mutually opposed sense, so that the sum of the squares of these gradients remains constant. Consequently, the direction $\phi$ of the magnetic gradient field resulting from the superposition of the magnetic gradient fields $G_x$ and $G_y$ changes in the z plane, the absolute value of its gradient remaining the same. Further sequences are then applied with a direction $\phi$ of the gradient which is varied from one sequence to another, until after N sequences (N may be between 32 and 256) with uniformly distributed gradient directions a set of MR data is obtained whereby an MR image of the slice excited by the RF pulses can be reconstructed. The whole operation is subsequently repeated once or several times.

The acquisition of a series of MR images from the MR signals acquired by the sequences will be described hereinafter with reference to FIG. 4. This series is to represent the dynamic processes in the examination zone at a frequency f. When the frequency f at which the MR images succeed one another must amount to, for example 25 images per second, per image 40 ms will be available. Considering the given repetition time $T_r$, n=4 sequences can be generated within this period of 40 ms.

FIG. 4 illustrates the acquisition of the MR dam, the gradient direction being plotted as the ordinate and the time as the abscissa.

Each point in this diagram corresponds to the acquisition of one MR signal, so that the distance in time between two successive points (MR signals) corresponds to the repetition time $T_r$ of the sequence shown in FIG. 2. The angular range between 0 and $\phi_{max}$ is then the range of gradient directions required for complete reconstruction of the nuclear magnetization distribution in the examination zone. For the sequence shown in FIG. 2, $\phi_{max}$ amounts to 180°; when the part of the gradients $G_x$ and $G_y$ active before the reading out of the MR signals (fifth line) is omitted, the FID (Free Induction Decay) produces an asymmetrical gradient echo; in this case $\phi_{max}$ amounts to 360°.

The sequences are combined so as to form groups of n sequences each (n= 4). The gradient directions associated with these sequences deviate by each time $d\phi$ within the group, where:

$$d\phi=\phi_{max}/n \qquad (1)$$

The time required for the acquisition of the MR signals of a group is denoted by the reference $T_g$ in FIG. 4, where:

$$T_g=nT_r=1/f \qquad (2)$$

For the acquisition of the N MR signals required for the reconstruction of an MR image, therefore, N/n groups of such sequences are required. The measuring time $T_m$ then required mounts to $N.T_r$ for N=128 and $T_r$=10 ms, i.e. approximately 1.3 seconds.

FIG. 5 shows the sequences in the k-space. The coordinates $k_x$, $k_y$ of the k-space represent the time integral over the gradient field $G_x$ or $G_y$ during the reading of the MR signals. Each sequence, or each MR signal produced thereby, corresponds to a straight line through the zero point of the k-space, the direction of the straight line corresponding to the gradient direction. The four sequences of the first group, or the MR signals associated therewith, are denoted by the references $S_{111}$, $S_{112}$, $S_{113}$ and $S_{114}$ in the FIGS. 4 and 5. These sequences are represented by solid lines in FIG. 5.

The gradient directions of the second group, denoted by the references $S_{121}$ ... $S_{124}$ in the FIGS. 4 and 5, are represented by dashed lines in FIG. 5 and the gradient directions of a further group are denoted by dash-dot lines. It appears that the gradient directions of a group deviate from those of any other group by a respective constant angle, i.e. so that the directions of the N sequences of the N/n sequence groups are uniformly distributed across the k-space.

After N sequences have been produced in this manner during the measuring time $T_m$, these sequences are repeated one or more times, without any modification whatsoever. The sequences of the first group of this repeat are denoted by the references $S_{211}$ ... $S_{214}$ in FIG. 4; they are identical to the sequences $S_{111}$ ... $S_{114}$. Similarly, the sequences $S_{221}$ ... $S_{224}$ of the second group of this repeat are identical to the sequences $S_{121}$ ... $S_{124}$, etc.

A first MR image can be reconstructed from the first N sequences. The measuring time $T_m$ elapses until the reconstruction of this first image.

The second MR image is reconstructed essentially by means of the same MR data as the first one, merely the MR data supplied by the first group of sequences $S_{111}$ ... $S_{114}$ being replaced by the MR data of the group $S_{211}$ ... $S_{214}$. The latter MR data is available after the period of time $T_g$ (40 ms) after the acquisition of the MR data set for the first image. For the third image of the image series, for which the data acquisition is terminated after a further 40 ms, additionally the MR data supplied by the second group $S_{121}$ ... $S_{124}$ are replaced by the MR data supplied by the second group $S_{221}$ ... $S_{222}$ of the sequences of the repeat. Thus, after each time the period $T_g$ an MR image updated by a further group of sequences can be generated. Because the gradient directions are uniformly distributed across the k-space in each group of sequences (see FIG. 5), the MR data supplied by such a group contain the information for a complete MR image with a direction-independent, low spatial resolution. The described artefacts of the known method are thus avoided to a very high degree.

FIG. 6 shows the block diagram of a signal processing unit for reconstructing a series of MR images from the MR signals. The MR signals received for the individual sequences are amplified by a unit 20 so as to be transposed to the baseband. The analog signal thus obtained is convened into a series of digital values by an analog-to-digital converter 21. The analog-to-digital converter 21 is controlled by a control unit 19 so that it generates digital data words only during the read-out phase (see fifth line of FIG. 2). The analog-to-digital converter 21 is succeeded by a unit 22 for fast Fourier transformation which performs a one-dimensional Fourier transformation over the series of sampling values produced by the digitization of an MR signal, which transformation is preferably so fast that it ends before the next MR signal is received.

The MR signals thus digitized and Fourier-transformed are written into a memory 23. A processing unit 24 performs a filtered backprojection on the data in the memory 23, thus providing the intensity of the nuclear magnetization in the individual pixels of an MR image which is stored in the memory 25. This image is displayed on a monitor 27 via a digital-to-analog converter 26.

The units 23 . . . 27 are controlled by a control unit 19 so that after the first N sequences a first MR image is formed in the memory 25 and displayed on the monitor 27. After n further sequences, this MR image is updated by means of these sequences. To this end, it would be feasible to replace the Fourier transforms of the signals $S_{111}$ . . . $S_{114}$ by the Fourier transforms of the signals $S_{211}$ . . . $S_{214}$ and to perform another filtered backprojection by means of this newly added data as well as by means of the Fourier transforms of the N/n preceding MR signals. However, for this renewed backprojection again N Fourier transforms would have to be processed.

It is substantially simpler to form, analogously to the method of U.S. Pat. No. 4,830,012, only the difference between the n newly added Fourier transforms and the n Fourier transforms they replace (i.e. $S_{211}-S_{111}$ . . . $S_{214}-S_{114}$)) and to make the unit 24 calculate merely the contribution of these n differences to the individual pixels of the MR image for superposition on the stored image.

As has already been stated, each of the groups of sequences used for a new MR image already supplies the information for an MR image with a low resolution. The resolution can be enhanced by combining, for example n=8 (instead of n=4) sequences to form a respective group, the n gradient directions of each group again having to be distributed uniformly across the k-space. However, for this doubled spatial resolution the image frequency ($f=1/(nT_r)$) is only half as high. Depending on the examination method, however, the value n can also be reduced and hence the image frequency f increased and the spatial resolution decreased. In order to enable adaptation of these examination parameters to the relevant requirements there is provided an input unit 28, for example a keyboard, via which the operator can adjust the value n and hence the image frequency as well as the spatial resolution.

If there are motions caused by the heart beat, the resulting artifacts may be further reduced by means for synchronizing the sequences with the ECG of a patient arranged in the examination zone.

We claim:

1. A magnetic resonance (MR) imaging method, comprising causing sequences to act on an examination zone in the presence of a steady magnetic field to generate respective MR signals, each sequence comprising at least one RF pulse and a magnetic gradient field active during generation of a respective MR signal, and reconstructing a series of MR images from respective successive sets of the MR signals thus generated, wherein the gradient magnetic field active during generation of a respective MR signal has a direction which is varied from one sequence to another and after a first set, each next set is formed from a last set used for reconstruction of an MR image of the series by replacing only a subset of oldest generated MR signals with a subset of newly generated MR signals, and the sets are such that, for each set, a range of directions of the gradient magnetic fields active during generation of the MR signals of the set less the subset of newly generated MR signals are uniformly distributed between the respective directions of the gradient magnetic fields active during generation of the MR signals of the subset of newly generated MR signals.

2. A device as claimed in claim 1, further comprising operator input means for entering the number of Fourier transformed detected MR signals to be replaced in partly updating each last set.

3. A device as claimed in claim 1, further comprising means for synchronizing the sequences with an ECG of a patient arranged in the examination zone.

4. A device as claimed in claim 2, further comprising means for synchronizing the sequences with an ECG of a patient arranged in the examination zone.

5. A magnetic resonance (MR) imaging device comprising:

a) a magnet for generating a uniform, steady magnetic field in an examination zone, b) an RF coil system for generating RF pulses in the examination zone, c) a gradient coil system for generating a magnetic gradient field in the examination zone having a variable gradient direction, d) sequence control means for controlling said RF coil system and said gradient coil system to generate sequences acting on the examination zone, each sequence including at least one RF pulse and a magnetic gradient field having a direction which is varied from one sequence to another, e) means for detecting MR signals generated by the sequences, f) means for Fourier transformation of the detected MR signals, g) means for storing the Fourier transformed detected MR signals and forming the stored Fourier transformed detected MR signals into successive sets of MR data, each next set, after a first set, being formed by partly updating a last set by replacing a subset consisting of a number of Fourier transformed detected MR signals, wherein for each set, a range of directions of the gradient magnetic fields active during generation of the MR signals of the set less the subset of MR signals are uniformly distributed between the respective directions of the gradient magnetic fields active during generation of the MR signals of the subset, and h) means for backprojecting the successive sets of MR data in order to form a series of updated MR images.

6. A magnetic resonance (MR) imaging method, comprising causing sequences to act on an examination zone in the presence of a steady magnetic field to generate respective MR signals, each sequence comprising at least one RF pulse and a magnetic gradient field active during generation of a respective MR signal, and reconstructing each MR image of a series of MR images from a same first number of successively generated subsets of the MR signals thus generated, each subset consisting of a same second number of MR signals, wherein the gradient magnetic field active during generation of a respective MR signal is such as to cause a scan through k-space along a path which includes the origin of k-space, which path is rotated about the origin from one sequence to another so that the paths of the MR signals of each first number of successively generated subsets are different from each other and, for each subset, all points on the paths of the MR signals of the subset at a same radial distance from the origin are uniformly spaced apart.

* * * * *